United States Patent
Catthoor et al.

(10) Patent No.: US 8,839,082 B2
(45) Date of Patent: Sep. 16, 2014

(54) METHODS FOR VITERBI DECODER IMPLEMENTATION

(71) Applicants: IMEC, Leuven (BE); Samsung Electronics Co. Ltd., Suwon-si (KR)

(72) Inventors: Francky Catthoor, Temse (BE); Frederik Naessens, Roeselaere (BE); Praveen Raghavan, Tamil Nady (IN)

(73) Assignees: IMEC, Leuven (BE); Samsung Electronics Co., Ltd., Gyeonggi-do (KR)

( * ) Notice: Subject to any disclaimer, the term of this patent is extended or adjusted under 35 U.S.C. 154(b) by 77 days.

(21) Appl. No.: 13/739,852

(22) Filed: Jan. 11, 2013

(65) Prior Publication Data

US 2013/0198594 A1    Aug. 1, 2013

(30) Foreign Application Priority Data

Jan. 27, 2012    (EP) ..................... 12152976

(51) Int. Cl.
| | | |
|---|---|---|
| *H03M 13/03* | (2006.01) | |
| *G06F 11/00* | (2006.01) | |
| *G06F 17/50* | (2006.01) | |
| *G06F 11/22* | (2006.01) | |
| *H03M 13/25* | (2006.01) | |
| *H03M 13/41* | (2006.01) | |
| *H03M 13/00* | (2006.01) | |

(52) U.S. Cl.
CPC ......... *H03M 13/256* (2013.01); *G06F 17/5059* (2013.01); *H03M 13/41* (2013.01); *H03M 13/65* (2013.01)
USPC .............................. 714/795; 714/37; 716/136

(58) Field of Classification Search
CPC .......... H03M 13/256; H03M 13/2972; H03M 13/25; G06F 17/5059; G06F 17/5045
USPC ............ 714/95, 741, 32, 33, 25, 37; 716/136, 716/100, 106, 111, 132, 133, 50, 51, 54, 56
See application file for complete search history.

(56) References Cited

U.S. PATENT DOCUMENTS

| 7,017,126 B2 * | 3/2006 | Potkoniak et al. ............. 716/106 |
|---|---|---|
| 7,331,013 B2 * | 2/2008 | Rudosky et al. .............. 714/795 |

(Continued)

OTHER PUBLICATIONS

Lee et al., "A Single-Chip Viterbi Decoder for a Binary Convolutional Code Using an Adaptive Algorithm," IEEE Transactions on Consumer Electronics, vol. 41, No. 1 (Feb. 1995), pp. 150-159.

(Continued)

*Primary Examiner* — Christine Tu
(74) *Attorney, Agent, or Firm* — McDonnell Boehnen Hulbert & Berghoff LLP (57) ABSTRACT

Disclosed is a method for selecting a design option for a Viterbi decoder model. In some embodiments, the method includes deriving a set of design options for a Viterbi decoder model by differentiating at least one design parameter, where the at least one design parameter comprises at least a first value for a look-ahead parameter. The method further includes performing an evaluation of each design option in the set of design options in a multi-dimensional design space and, based on the evaluation of each design option, selecting a design option in the set of design options that (i) satisfies a predetermined energy efficiency constraint and (ii) yields at least a second value for the look-ahead parameter, wherein the second value is greater than the first value and satisfies a predetermined area budget.

14 Claims, 6 Drawing Sheets

(56) References Cited

U.S. PATENT DOCUMENTS

| 8,065,647 B2* | 11/2011 | Stevens | 716/113 |
| 2009/0089648 A1* | 4/2009 | Tsui et al. | 714/795 |

OTHER PUBLICATIONS

Habib et al., "Design Space Exploration of Hard-Decision Viterbi Decoding: Algorithm and VSLI Implementation," IEEE Transactions on Very Large Scale Integration Systems, vol. 18, No. 5 (May 2010), pp. 794-806.

Habib et al., "Automated Generation of Viterbi Decoders," Koninklijke Philips Electronics, Technical Note PR-TN 2006/00381 (Jul. 2006).

Liu et al., Algorithm-Based Low-Power and High-Performance Multimedia Signal Processing, Proceedings of the IEEE, vol. 86, No. 6 (Jun. 1998), pp. 1155-1202.

Cheng et al., "Hardware Efficiency Low-Latency Architecture for High Throughput Rate Viterbi Decoders," IEEE Transactions on Circuits and Systems II: Express Briefs, vol. 55, No. 12 (Dec. 2008), pp. 1254-1258.

Liu et al. "Low-Latency Low-Complexity Architectures for Viterbi Decoders," IEEE Transactions on Circuits and Systems I: Regular Papers, vol. 56, No. 10 (Oct. 2009), pp. 2315-2324.

Kim et al., "High-Rate, Low Power SST (Scarce State Transition) Scheme Viterbi Decoder Employing 4-Way ACS Units," The 5th CDMA International Conference (Nov. 2000).

Yeo et al., "A 500-Mb/s Soft-Output Viterbi Decoder," IEEE Journal of Solid-State Circuits, vol. 38, No. 7 (Jul. 2003), pp. 1234-1241.

Lin et al., "Design of a Power-Reduction Viterbi Decoder for WLAN Applications," IEEE Transactions on Circuits and Systems I: Regular Papers, vol. 52, No. 6 (Jun. 2005), pp. 1148-1156.

Sun et al., "Low-Power State-Parallel Relaxed Adaptive Viterbi Decoder," IEEE Transactions on Circuits and Systems I: Regular Papers, vol. 54, No. 5 (May 2007), pp. 1060-1068.

Altaf, "A Parallel Viterbi Decoder Implementation for High Throughput," Report for ECE 734 VLSI Array Processors for Digital Signal Processing, University of Wisconsin (May 2009).

He et al., "Integrated 64-State Parallel Analog Viterbi Decoder," IEEE International Symposium on Circuits and Systems (May 2000), pp. IV-761-IV-764.

Shr et al., "A Low-Complexity Viterbi Decoder for Space-Time Trellis Codes," IEEE Transactions on Circuits and Systems I: Regular Papers, vol. 57, No. 4 (Apr. 2010), pp. 873-885.

European Search Report, European Patent Application Serial No. 12152976.2 (Mar. 2012).

* cited by examiner

METHODS FOR VITERBI DECODER IMPLEMENTATION

CROSS-REFERENCE TO RELATED APPLICATION

This application claims priority to European Patent Application Serial No. EP 12152976.2 filed Jan. 27, 2012, the contents of which are incorporated by reference herein.

BACKGROUND

Convolutional encoding is widely used in many communication standards, including, for example, Wireless Local Area Network (WLAN) and Wi-Fi standards, such as 802.11a/b/g/n. Other examples are possible as well. In convolutional encoding, as in other error correction mechanisms, redundancy is added to the data so that the data can be recovered in the event it is corrupted by noise, channel conditions, and/or receiver non-idealities.

In a convolutional encoder, an input bit stream is applied to a shift register. Input bits are combined using a binary single bit addition (XOR) with several outputs of the shift register cells. The bit streams obtained at the output form a representation of the encoded input bit stream. Each input bit at the input of the convolutional encoder results in n output bits. The coding rate is thus defined as 1/n (or k/n if k input bits are used). These output bits are a function of the current input bit and the K previous input bits, where K is called the constraint length.

In general a convolutional code is identified by the following characteristics: the constraint length K, the number n of output branches, and the polynomial $G_x$ for each output branch. The constraint length K determines the number of memory elements in the shift register. It is defined as the shift register length plus one. Each branch in the number n of output branches outputs one bit. The polynomial $G_x$ for each output branch defines the relation of the output bit to the current input bit and K previous input bits. Each output bit is a modulo-2 addition (or XOR-operation) of some of the input bits. The polynomial $G_x$ indicates which bits in the input stream have to be added to form the output.

An encoder is completely characterised by n polynomials of degree K. The encoder can have different states, represented by the K input bits in the shift register. Every new input bit processed by the encoder leads to a state transition. The state diagram can be unfolded in time to represent transitions at each stage in time. Such representation is called a trellis diagram.

In a convolutional encoder, data bits are fed into delay line (of length K) from which certain branches are XOR-ed and fed to the output. Considering WLAN as an example, the throughput is stressed towards decoder output rates of 600 Mbps (in IEEE 802.11n standard) while keeping the energy efficiency as high as possible. In many cases, there is additionally a desire to keep the area footprint as low as possible. A Viterbi decoder implemented in a handheld device typically satisfies these requirements.

Figure 1:
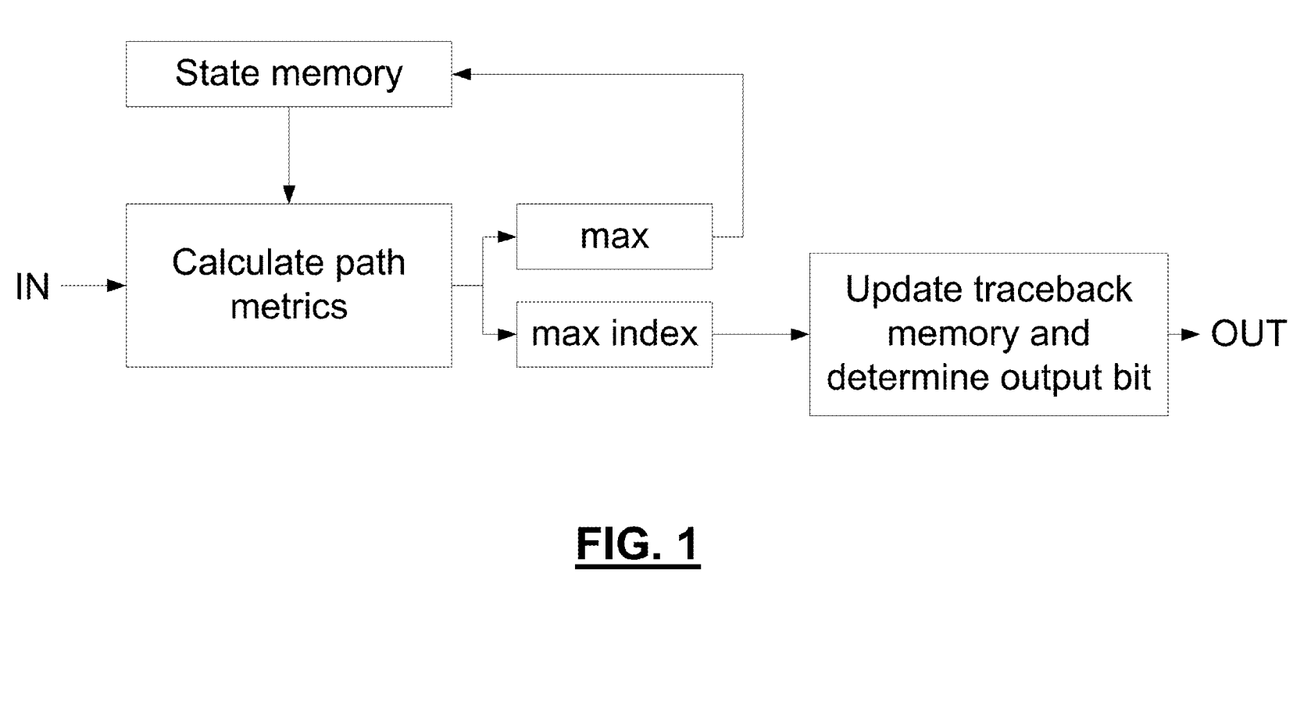
FIG. 1 illustrates a high level overview of Viterbi decoding.

Viterbi decoding is a well-known method for decoding convolutional error codes. Viterbi decoding is a near-optimal decoding of convolutional encoded data. Compared to optimal decoding, however, it has a greatly reduced complexity and memory requirement. In general, during decoding the most probable path over the trellis diagram is reconstructed using the received (soft) bits, and results in determining the original data. Specifically, in Viterbi decoding, a window (with a so-called trace-back length) is considered before taking a decision on the most probable path and corresponding decoded bit. Constraining the decision over a window, rather than the complete data sequence, considerably reduces complexity without sacrificing decoding performance significantly. A high-level view of the Viterbi decoding operation is depicted in FIG. 1.

Starting from input Log Likelihood Ratios (LLRs), path metrics are calculated for each of the $S=2^K-1$ paths. One of these paths is selected to be optimal and the result of this decision is stored into the trace-back memory. Once trace-back depth number of path metrics has been calculated, an output bit can be produced for every incoming pair of input LLRs.

Viterbi decoding is typically performed in a streaming fashion and the main bottleneck is situated in the state memory update. In order to boost the throughput, this iterative loop needs to be avoided or optimized. The principle of breaking down iterative loops into parallel computations is a known technique and the higher-level concept behind it has been applied in other domains since the 1980's. They have mainly worked on digital signal processor algorithms, but some iterative control algorithm kernels have also been treated this way. The idea of parallelizing Viterbi decoding has been described in the art. The principle of Viterbi decoding parallelization is sometimes also referred to as radix-$2^Z$ or Z-level look-ahead (LAH) decoding. Look-ahead techniques combine several trellis steps into one trellis step in time sequence through parallel computation. The number of combined trellis steps defines the look-ahead factor Z.

Based on the techniques explained above, many contributions have been made to offer high-speed Viterbi decoding. Some of these contributions only address solutions for a limited number of states and have a clear focus on boosting performance without taking into account a possible trade-off with area and energy. Others of these contributions exploit look-ahead techniques to allow extra pipelining inside the decoding loop, resulting in throughputs which are equal or lower than a single bit per clock cycle.

The paper "*Design Space Exploration of Hard-Decision Viterbi Decoding: Algorithm and VLSI Implementation*" (Irfan Habib et al., IEEE Trans. on Very Large Scale Integration (VLSI) Systems, vol. 18, no. 5, May 2010) presents an extensive design space exploration for performing Viterbi decoding, taking into account area, throughput, and power. At a top level, a typical Viterbi decoder consists of three units, namely the branch metric unit (BMU), the path metric unit (PMU), and the survivor memory unit (SMU). The paper explores the design space for each unit.

The BMU calculates the distances from the received (noisy) symbols to all code words. The measure calculated by the BMU can be, for example, the Hamming distance, in the case of the hard input decoding, or the Manhattan/Euclidean distance, in the case of the soft input decoding (e.g., every incoming symbol is represented using several bits).

The PMU accumulates the distances of the single code word metrics produced by the BMU for every state. Under the assumption that zero or one was transmitted, corresponding branch metrics are added to the previously stored path metrics which are initialized with zero values. The resulting values are compared with each other and the smaller value is selected and stored as the new path metric for each state. In parallel, the corresponding bit decision (zero or one) is transferred to the SMU while the inverse decision is discarded.

Finally, the SMU stores the bit decisions produced by the PMU for a certain defined number of clock cycles (referred to as the trace-back depth (TBD)) and processes them in a reverse manner called backtracking. Starting from a random state, all state transitions in the trellis will merge to the same state after TBD (or fewer) clock cycles. From this point on, the decoded output sequence can be reconstructed.

The Habib paper mentions that the PMU is a critical block both in terms of area and throughput. The key problem of the PMU design is the recursive nature of the add-compare-select (ACS) operation (in which path metrics calculated in the previous clock cycle are used in the current clock cycle). In order to increase the throughput or to reduce the area, optimizations can be introduced at algorithmic, word, or bit level. Word level optimizations work on folding (serialization) or unfolding (parallelization) the ACS recursion loop.

In the folding technique, the same ACS is shared among a certain set of states. This technique trades off throughput for area. This is an area-efficient approach for low throughput decoders, though in case of folding, routing of the path metrics becomes quite complex.

In the unfolding technique, two or more trellis stages are processed in a single recursion (i.e., look-ahead, as described above). If look-ahead is short, the area penalty is not high. Radix-4 look ahead (i.e., processing two bits at a time, Z=2) is a commonly used technique to increase decoder's throughput.

Although the Habib paper mentions that look-ahead can be used to enhance throughput, it states in section IV.F that use of look-ahead is to be dissuaded, as the authors consider look-ahead techniques extremely expensive in terms of area and power consumption. Therefore, the design space exploration results do not consider the look-head option as an optimal trade-off point in the area versus power trade-off dimension. Moreover, the Habib paper only considers maximal power consumption and not energy consumption for executing the Viterbi decoder task.

SUMMARY

Disclosed is a method for determining a Viterbi decoder implementation as a result of a design space exploration, where at least one look-ahead parameter is considered.

In some embodiments, the method includes deriving a set of design options for a Viterbi decoder model by differentiating at least one design parameter, where the at least one design parameter comprises at least a first value for a look-ahead parameter. The method further includes performing an evaluation of each design option in the set of design options in a multi-dimensional design space and, based on the evaluation of each design option, selecting a design option in the set of design options that (i) satisfies a predetermined energy efficiency constraint and (ii) yields at least a second value for the look-ahead parameter, wherein the second value is greater than the first value and satisfies a predetermined area budget.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

BRIEF DESCRIPTION OF THE DRAWINGS

The present disclosure will now be described further, by way of example, with reference to the accompanying drawings, in which.

DETAILED DESCRIPTION

The present disclosure will be described with respect to particular embodiments and with reference to certain drawings, but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

In the present disclosure multiple Viterbi decoder implementations are derived given a number of constraints with respect to area, throughput and energy efficiency. An optimal Viterbi decoder solution is then selected within a trade-off analysis space with the following dimensions: 1) logic area, 2) achievable throughput, and 3) energy efficiency, the 'optimal' implementation being the best implementation from the set of possible implementations corresponding to the specific requirements. In contrast to the Habib paper, look-ahead is not ruled out as a parameter affecting the determination of an optimal implementation, and energy is considered instead of power consumption.

The proposed approach does not use power as metric, because with a practical throughput requirement (which might be significantly lower than the maximum possible), a maximum power number doesn't give an objective measure for comparison. In contrast, energy is considered as the only viable efficiency metric because it takes into account the maximum achievable throughput (which possibly may be higher than the required throughput) and offers a fair comparison. The proposed solution clearly identifies multiple design options among which a look-ahead solution with a certain look-ahead parameter value is one.

Many different configuration options are available for implementing a Viterbi decoder. Table 1 illustrates the impact on area, maximum power consumption, throughput and bit error rate (BER) performance of increasing values of two possible parameters, namely the look-ahead parameter and the trace back length:

TABLE 1

|  | LAH | Trace-Back Depth |
|---|---|---|
| Area | ⇑ | ⇑ |
| Throughput | ⇑ | = |
| Max. Power Consumption | ⇑ | ⇑ |
| BER Performance | = | ⇑ |

In the present disclosure, at least the look-ahead parameter (LAH) is available for optimization. Optionally, the trace-back depth and other parameters (e.g., word width quantization, SMU memory organization, etc.) are taken into account in the design space exploration as well. The disclosure presents a qualitative exploration of the design space for area and throughput in which in addition energy efficiency is considered in the trade-off space. In the proposed approach, power is clearly not used as metric, because with a practical throughput requirement, a maximum power number doesn't give an objective measure for comparison. Instead, energy is considered as only viable efficiency metric because it takes into account the achievable throughput and offers a fair comparison.

It is now explained how the various implementation options can be derived. In order to derive various Viterbi decoder implementations and compare them with respect to area, power, and energy, the actual decoding is modelled into a processor pipeline. The choice for such a modelling helps to derive multiple implementation instantiations and explore them into the desired trade-off analysis space. Note however that processor pipeline modelling is not mandatory. An alternative may be, for example, a dedicated Register Transfer Level (RTL) implementation. Other examples are possible as well.

Figure 2:
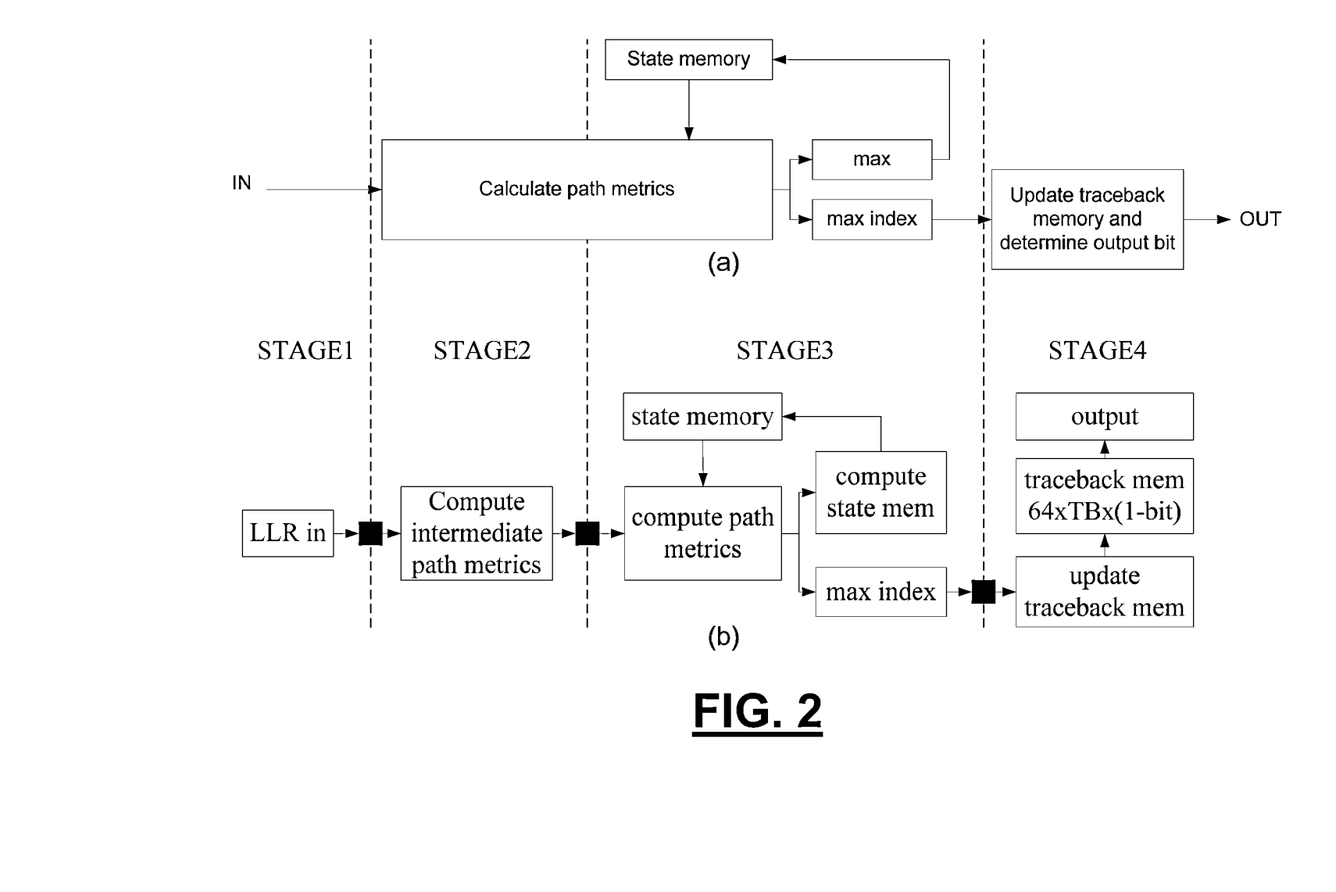
FIG. 2 illustrates a view on the Viterbi decoding pipeline.

The Viterbi decoding pipeline can be modelled, for example, inside an application-specific instruction-set processor (ASIP) architecture. Such an approach offers the advantage that the pipeline control overhead can be handled automatically by existing tools (e.g., Target). FIG. 2 illustrates a view on the Viterbi decoding pipeline (which is, in essence, a pipeline implementation of the scheme shown in FIG. 1). As shown in FIG. 2, two input LLRs can be retrieved and a single (hard-decision) output bit is generated per clock cycle. As shown, the decoding itself is decomposed into four distinct pipeline stages: Stage 1: Registering of input LLRs; Stage 2: Calculating intermediate values of path metrics; Stage 3: Deducting path metrics and next state memory value, together with a maximum index which will be used for trace-back memory update; and Stage 4: Updating trace-back memory and determine hard decision output bit.

There is no need for an external memory. The required data storage, inside the decoder pipeline, is taken care of by means of flip-flops instead of memory macros. Instead of connecting a program memory to the ASIP, the instruction bits are derived from valid LLR input bits and Viterbi state reset. The instruction set decoding for a stand-alone Viterbi is depicted in Table 2, showing the usage of the control signals with priority for Viterbi state reset:

TABLE 2

| Bits | Syntax | Semantic |
|---|---|---|
| 10 | vit | Triggers Viterbi decoding pipeline |
| X1 | vit_init | Resets state of Viterbi decoder engine |
| 00 | nop | No operation |

Figure 3:
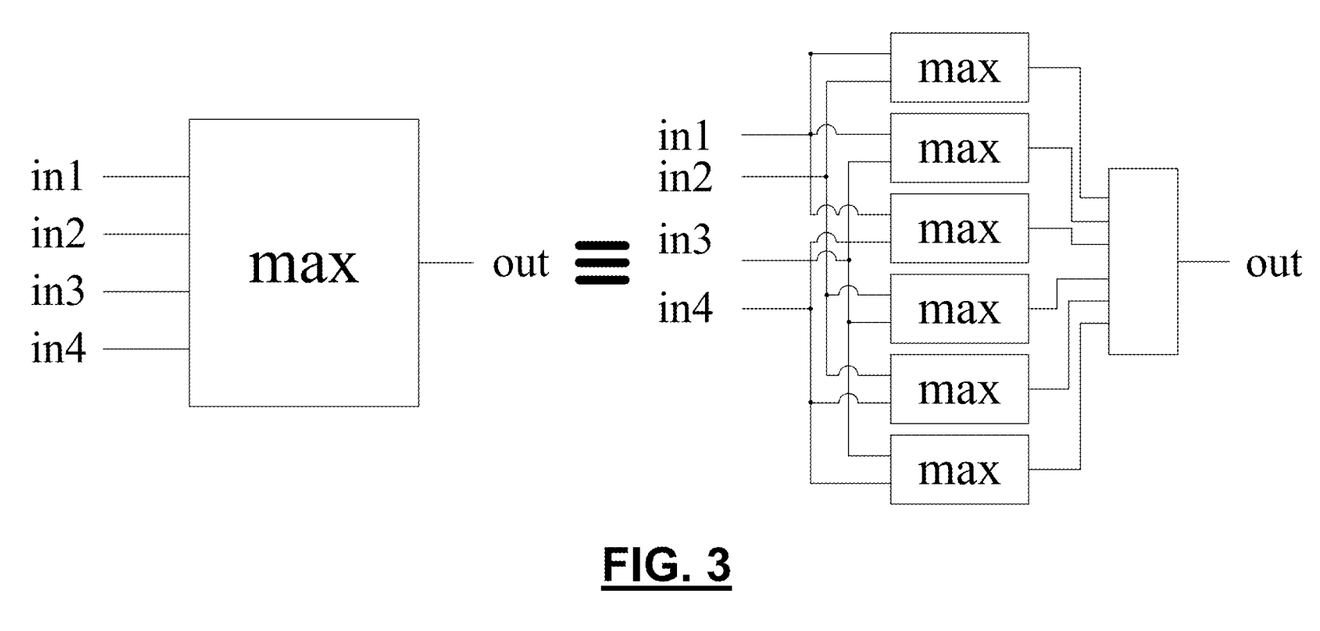
FIG. 3 illustrates a 4-input max reworked towards multiple 2-input max operations.

In the case of a look-ahead Viterbi decoder the pipeline structure and instruction set decoding remain fully identical. The only differences come from the fact that the look-ahead implementation is applied and that, if, for example, a look-ahead factor of 2 is considered, four input LLRs are retrieved. Hence, the maximum over four values needs to be derived. The 4-input max is replaced by six 2-input max operations, which can be conducted in parallel, and the maximum can be found by logical combinations of these 2-input max operations, as depicted in FIG. 3, which illustrates a 4-input max reworked towards multiple 2-input max operations.

With this implementation of the 4-input max one tries to keep the latency close to the straightforward radix-2 solution (i.e., without look-ahead, Z=1), allowing doubling the throughput for the same target clock frequency. Increasing the clock too much for a given technology leads to increased area and power consumption. In order to meet the high demanding latency and throughput constraints it is necessary to consider optimization techniques like look-ahead while maintaining the clock constraints like in the straightforward radix-2 solution.

An advantageous way to implement look-ahead is as follows. As already mentioned, the main critical path is located inside the state memory calculation loop as indicated in FIG. 1. The calculation of the next stage state memory values can be written as:

$$\gamma_{1,k+1} = \max(\phi_{1,1,k} + \gamma_{1,k}, \phi_{1,2,k} + \gamma_{2,k})$$

$$\gamma_{2,k+1} = \max(\phi_{2,1,k} + \gamma_{3,k}, \phi_{2,2,k} + \gamma_{4,k})$$

...

$$\gamma_{S,k+1} = \max(\phi_{S,1,k} + \gamma_{S-1,k}, \phi_{S,2,k} + \gamma_{S,k}), \quad \text{Equation (1)},$$

where $\gamma_{x,y}$ indicates the state memory value x at iteration y and $\phi_{n,m,y}$ indicates the intermediate path metric value {n,m} at iteration y (containing itself the sum/subtraction of two LLR input values).

When re-writing using the convention max→$\oplus$ and add→$\otimes$, Equation (1) can be rewritten as:

$$\gamma_{1,k+1} = (\phi_{1,1,k} \otimes \gamma_{1,k}) \oplus (\phi_{1,2,k} \otimes \gamma_{2,k}) \quad \text{Equation (2)}.$$

For number of states S equal to 64, the matrix form notation can be $$\begin{bmatrix} \gamma_1 \\ \gamma_2 \\ \cdots \\ \gamma_{33} \\ \gamma_{34} \\ \cdots \\ \gamma_{64} \end{bmatrix}_{k+1} = \begin{bmatrix} \varphi_{1,1} & \varphi_{1,2} & 0 & 0 & \cdots & 0 & 0 \\ 0 & 0 & \varphi_{2,1} & \varphi_{2,2} & \cdots & 0 & 0 \\ \cdots & \cdots & \cdots & \cdots & \cdots & \cdots & \cdots \\ \varphi_{33,1} & \varphi_{33,2} & 0 & 0 & \cdots & 0 & 0 \\ 0 & 0 & \varphi_{34,1} & \varphi_{34,2} & \cdots & 0 & 0 \\ \cdots & \cdots & \cdots & \cdots & \cdots & \cdots & \cdots \\ 0 & 0 & 0 & 0 & \cdots & \varphi_{64,1} & \varphi_{64,2} \end{bmatrix} \otimes \begin{bmatrix} \gamma_1 \\ \gamma_2 \\ \cdots \\ \gamma_{33} \\ \gamma_{34} \\ \cdots \\ \gamma_{64} \end{bmatrix}_k, \quad \text{Equation (3)}$$

or:

$$\Gamma_{k+1} = \Lambda_k \otimes \Gamma_k \quad \text{Equation (4)},$$

which allows $$\Gamma_{k+2} = \Lambda_{k+1} \otimes \Lambda_k \otimes \Gamma_k.$$

Due to the special form of the $\Lambda$ matrix, one can write

This principle is applicable to multiple levels of look-ahead. A summary of the computational effort both for straightforward as look-ahead implementation is given in Table 3 below. With increasing look-ahead factor Z, the throughput increases linearly, while the complexity increases quadratic with respect to the number of additions and maximum calculation inputs. Note that one can exploit (part of) the throughput increase to add extra pipelining inside the computational loop.

TABLE 3

|  | No Look-Ahead | Look-Ahead Factor Z (Radix-$2^Z$) |
| --- | --- | --- |
| Number of LLR inputs | 2 | $2 \times Z$ |
| Additions | $2 \times S$ | $2^Z \times S$ |
| Max Operations | S | S |
| Input Ports to Max Operation | 2 | $2^Z$ |

Figure 4:
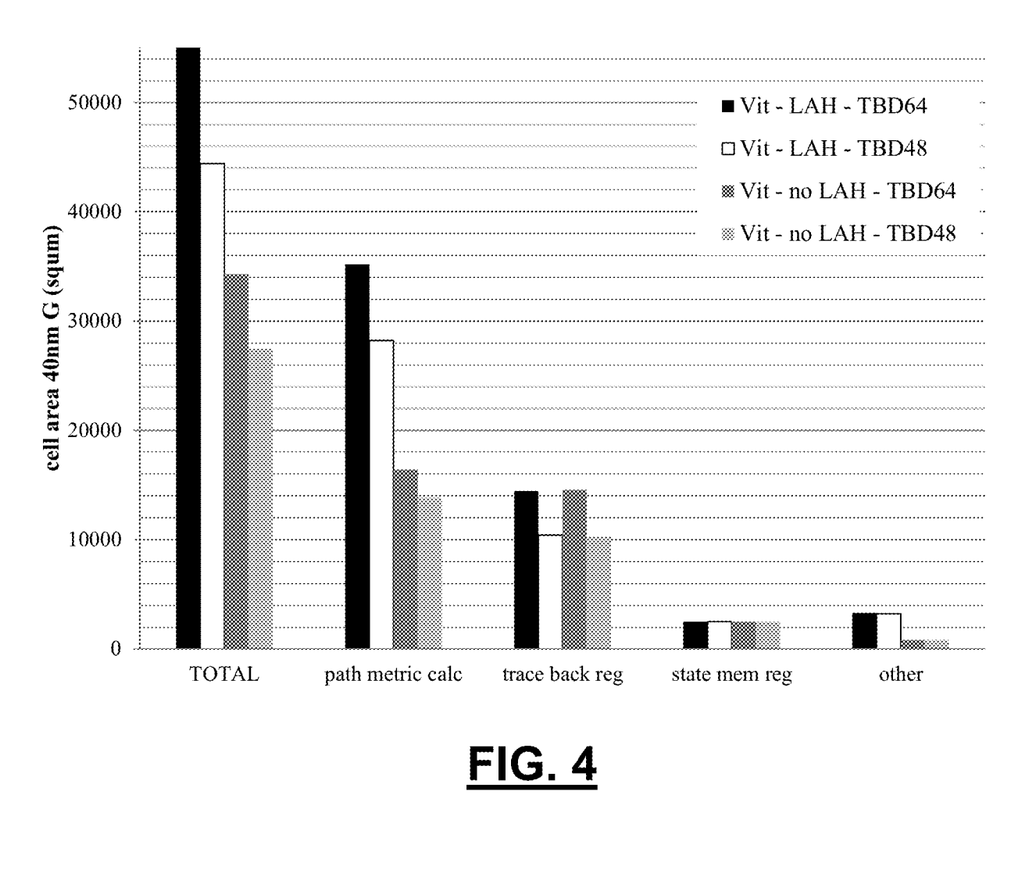
FIG. 4 illustrates an area comparison for a number of Viterbi decoder instances.

FIG. 4 illustrates an area comparison for a number of Viterbi decoder instances. The instances are implemented in a commercial CMOS technology: with a look-ahead factor of 2 or 1 (i.e., without look-ahead, i.e., a radix-2 solution) and a trace-back length of 64 or 48. As shown in FIG. 4, the look-ahead implementation indeed adds complexity to the path metric calculation, which results in an increased area. It roughly requires a doubling in complexity. In addition to the path metric calculation, the trace-back memory is also taking a considerable area. The choice of the trace-back length affects the implementation in the trace-back memory and path metric calculation.

Figure 5:
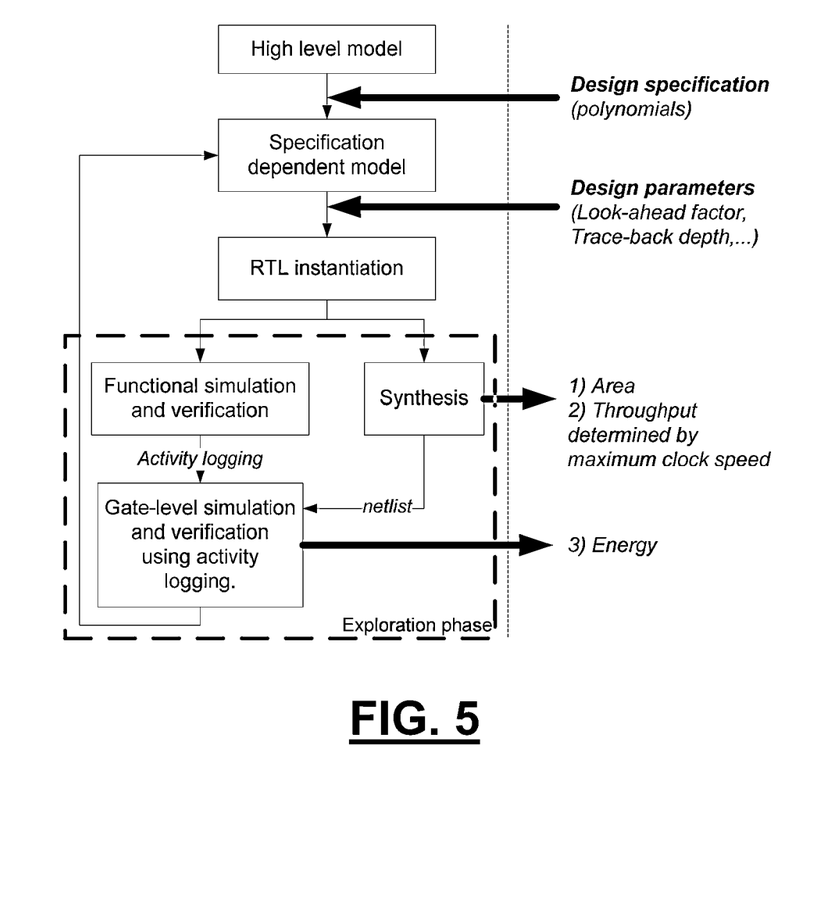
FIG. 5 illustrates a design exploration flow.

FIG. 5 illustrates a design exploration flow of the approach. The starting point is the high-level model which allows to instantiate towards a more specific Viterbi decoder model identified with the defined design specification (i.e., the polynomials). Next, by taking into account the design parameters (e.g., look-ahead, varying trace-back depth, and soft LLR input quantization), different Register Transfer Level (RTL) versions of a Viterbi decoder defined based on the processor pipeline model are derived and then verified. Tools can be used for obtaining the set of possible RTL implementations and verifying them functionally. The RTL implementation serves as input for an evaluation of area, throughput, and energy. An evaluation of these results within a three-dimensional trade-off space will allow determining the 'optimal' Viterbi decoding solution.

The necessary steps to characterize a Viterbi decoder implementation within this three-dimensional trade-off space are as follows. The first step is logic synthesis towards a technology dependent net list (resulting in an area and throughput characterization). The second step is functional verification combined with logging of signal toggle information (comprising the signal transitions over time during $$\Lambda_{k+1} \otimes \Lambda_k = \begin{bmatrix} \beta_{1,1} & \beta_{1,2} & \beta_{1,3} & \beta_{1,4} & 0 & 0 & 0 & 0 & 0 & \cdots & 0 & 0 \\ 0 & 0 & 0 & 0 & \beta_{2,1} & \beta_{2,2} & \beta_{2,3} & \beta_{2,4} & 0 & \cdots & 0 & 0 \\ \cdots & \cdots & \cdots & \cdots & \cdots & \cdots & \cdots & \cdots & \cdots & \cdots & \cdots & \cdots \\ \beta_{33,1} & \beta_{33,2} & \beta_{33,3} & \beta_{33,4} & 0 & 0 & 0 & 0 & 0 & \cdots & 0 & 0 \\ 0 & 0 & 0 & 0 & \beta_{34,1} & \beta_{34,2} & \beta_{34,3} & \beta_{34,4} & 0 & \cdots & 0 & 0 \\ \cdots & \cdots & \cdots & \cdots & \cdots & \cdots & \cdots & \cdots & \cdots & \cdots & \cdots & \cdots \\ 0 & 0 & 0 & 0 & 0 & 0 & 0 & 0 & 0 & \cdots & \beta_{64,3} & \beta_{64,4} \end{bmatrix}. \quad \text{Equation (5)}$$

decoding operation). The third step involves power estimations using net list and toggle information obtained in previous steps, which allows determining the power and calculating the energy afterwards. These steps are further detailed in the next paragraphs.

In the first step, synthesis towards a commercially available technology allows deriving the area occupation of the investigated solution. This synthesis step transforms the RTL code into a technology dependent net list. In addition to the RTL code, this commercial synthesis tool also takes technology library information into account. With clock frequency as an input to the synthesis tool together and timing reporting as an output from the synthesis tool, one can derive the throughput of the Viterbi decoding implementation. Note that this throughput is determined by the achieved clock frequency, on the one hand, and by the possible usage of look-ahead, on the other. For example, to perform the analysis, a commercial 40 nm technology with frequency target of 800 MHz may be selected. The selected frequency target matches what the selected technology maximally has to offer, taking into account the logical depth in the critical path of the architecture. A higher frequency would lead to high area and power penalties, whereas a lower frequency would lead to underutilization of the technology.

In the second step, a simulation and verification is performed based on the RTL code, allowing a validation of the functional correctness. In addition, data signal logging is performed, which will serve as input towards the power analysis performed in the next step.

Finally, in the third step, power estimations are determined based on simulations, taking into account the net list as output of the synthesis with activity diagrams of functional simulation. These power estimations are carried out using commercial tools and technology library information. Based on activity diagram (which includes logic transitions), the power consumed inside each of the gates of the net list can be determined. Once the power number is obtained, one can derive the energy by dividing the power with the throughput. As noted above, energy is the only viable global metric to objectively compare different Viterbi decoding solutions. Due to the relative smallness of leakage power in the technology nodes targeted here compared to the switching/dynamic power, in this embodiment only the switching/dynamic power is considered for the conversion towards energy. However, in other embodiments the same methodology can be applied in technologies where leakage power is not negligible compared to switching/dynamic power. In this latter case, the only difference is that both components would be computed and added up prior to calculating the energy. This will also influence the exploration step, as the design options will be located at different positions. As will be understood by the person of ordinary skill in the art, the principles of the effective exploration are still reusable.

During the exploration, design options can be changed and the flow to obtain area, timing, and power is followed. Conversion from power towards energy is performed by dividing power by throughput. This energy together with the area report from the synthesis and the achievable throughput yield a point in the trade-off analysis space. An example selection of which Viterbi decoder implementations are to be analyzed within the trade-off space is described below.

In order to select a Viterbi decoder implementation from the set of design options according to this disclosure, a first step involves determining a first value for the look-ahead parameter. This is based on the throughput requirement. The following example is given as an illustration. Within the WLAN scenario the maximum throughput requirement per Viterbi decoder instance is equal to 600 Mb/s. An acceptable implementation of a Viterbi decoder (without look-ahead) can achieve an output bit per clock cycle. Within the selected technology node (e.g. 40 nm), this may be achievable even without applying look-ahead techniques. Such a result would not incite the skilled person to further explore the design space with respect to look-ahead. However, as will become apparent below, considering look-ahead in the further design exploration may indeed lead to a more energy efficient solution.

As described above, the design options explored in the considered example involve look-ahead factor and trace-back depth. Area numbers mapped onto a commercial 40 nmG technology are given for the logic part only. All memories and registers linked to the Viterbi decoding are synthesized, no memory macros are used. For these different Viterbi decoder implementations, with different design options, the analysis described above and summarized in FIG. 5 is applied. The steps include RTL generation, synthesis, functional verification and gate-level simulation. This results in an area, throughput and power number for each of the decoder implementations. As described above, energy is the only objective global comparison metric and, hence it is derived based on throughput and power consumption.

An overview of the results for the different implementation forms, in a commercial 40 nm technology, can be found in Table 4. Here, the clock assumption for each decoder implementation is equal to 800 MHz, as motivated earlier for the 40 nm technology assumption in this illustration.

TABLE 4

| Implementation | Cell Area [squm] | Leakage [mW] | Dynamic [mW] | Throughput [Mbps] | Energy [nJ/bit] |
|---|---|---|---|---|---|
| Vit no LAH TB64 | 34305 | 1.22 | 249.52 | 800 | 0.312 |
| Vit no LAH TB48 | 27454 | 0.97 | 146.27 | 800 | 0.183 |
| Vit LAH TB64 | 55481 | 2.05 | 283.83 | 1600 | 0.177 |
| Vit LAH-TB48 | 44406 | 1.61 | 171.09 | 1600 | 0.107 |

The results shown in Table 4 can be summarized in a table similar to Table 1, as shown below in Table 5. Applying an increased level of look-ahead is shown to be beneficial with respect to energy. This observation could not be made by only considering power consumption.

TABLE 5

|  | LAH | Trace-Back Depth |
|---|---|---|
| Area | ⇧ | ⇧ |
| Throughput | ⇧ | = |
| Energy | ⇩ | ⇧ |
| BER Performance | = | ⇧ |

Figure 6:
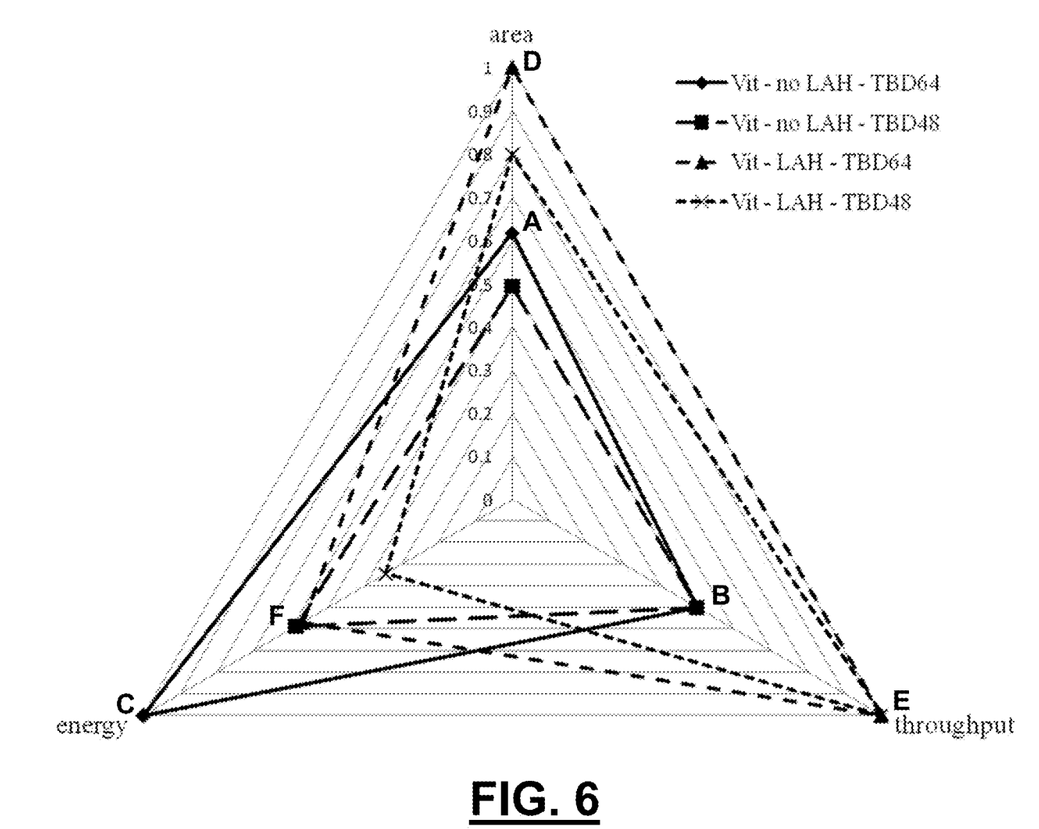
FIG. 6 illustrates a trade-off between area/energy efficiency/throughput.

FIG. 6 illustrates a trade-off between area/energy efficiency/throughput. In particular, FIG. 6 shows a graphical representation of the trade-off based on area, energy and throughput with a normalized axis. As shown in FIG. 6, there are multiple interesting implementation options present in the solution space. The best implementation may be chosen based on the relative importance of different optimization criteria including, for example, area, energy, BER, throughput and flexibility.

When considering the trade-off analysis depicted in FIG. 6, some optimal points can be identified. Some trade-offs present in these solutions are now explained. In cases where a solution is highly area-constrained and the achievable throughput can be reached without look-ahead, the optimal solution may be a traditional streaming radix-2 implementation. In these cases, applying look-ahead can merely be seen as a possible way to boost the throughput performance. For this particular solution, then, energy is not of high importance. An example of the reasoning of a highly area-constrained mode, based on the results depicted on FIG. 6, shows that a solution without look-ahead identified with triangle ABC gives a better trade-off over a solution with look-ahead identified with triangle DEF. The resulting energy efficiency and area is still dependent on the trace-back depth, which is an extra trade-off that can be made depending on the targeted BER performance.

On the other hand, when area can be sacrificed in order to achieve better energy efficiency, a look-ahead implementation is clearly an advantageous option. In cases where the targeted throughput is achieved anyway, it may not be required to have the look-ahead implementation for the sake of throughput performance. This is shown in FIG. 6, where the solution with look-ahead identified with triangle DEF has a clear energy advantage over solution without look-ahead identified with triangle ABC. Thus, in these cases the look-ahead technique did not merely enhance the throughput, but also improved energy.

The throughput increase offered by the look-ahead principle could be utilized in many forms. One possibility would be to employ the throughput increase in order to meet the target standard. Further, the increase could be exploited to shut down the decoder quicker, saving on leakage.

A second possibility would be to lower the clock frequency accordingly in case the throughput is not desired at all. This, however, would lead to almost identical points in the trade-off analysis space. The synthesis could then be done with lower target frequency. However, going for a lower target clock would make sense in cases where a further parallelization of the decoder architecture and removal of more pipelining was done to increase the logic between two pipeline-stages. The complexity (hence area) would then increase more than linearly.

A third possibility would be to lower the frequency target combined with a lower logic voltage. In contrast to the second possibility, the possible underutilization of the technology (through selecting a lower frequency target), is used to apply a lower logic voltage. Further, the possible area gain would be lower than with the second possibility. Energy efficiency, on the other hand, is influenced in a quadratic fashion with the lower logic voltage. Overall, a reduction of the TBD leads to a solution which has a lower area and better energy efficiency, although there is a lower bound for this TBD length based on the desired BER performance.

Viterbi decoding is present in many of the existing wireless standards (e.g., WLAN, WiMax, etc.). Given the number of standards and modes which need to be supported, flexible implementations are becoming a viable option, for which ASIPs are commonly proposed. The selected Viterbi decoder implementation could be part of such a flexible ASIP architecture for multi-standard, multi-mode error decoder engine, in particular because of the specific pipeline implementation form, While the above disclosure focused on Viterbi decoder requirements driven by the WLAN standard, the proposed approach can readily be generalised, as will be understood by the person of ordinary skill in the art. Hence, conclusions can be applicable to other Viterbi decoding requirements.

While the disclosure has been illustrated and described in detail in the drawings and foregoing description, such illustration and description are to be considered illustrative and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A method comprising:
    deriving a set of design options for a Viterbi decoder model by differentiating at least one design parameter, wherein:
        the at least one design parameter comprises at least a first value for a look-ahead parameter, and
        the look-ahead parameter indicates a number of trellis stages combined in a single step of a Viterbi decoding process of the Viterbi decoder model;
    performing an evaluation of each design option in the set of design options in a multi-dimensional design space;
    based on the evaluation of each design option, selecting a design option in the set of design options that (i) satisfies a predetermined energy efficiency constraint and (ii) yields at least a second value for the look-ahead parameter, wherein the second value is greater than or equal to the first value and satisfies a predetermined area constraint for an area of the design space.

2. The method of claim 1, wherein the multi-dimensional design space comprises a three-dimensional design space.

3. The method of claim 1, wherein performing the evaluation of each design option comprises performing a logic synthesis towards a technology-dependent description.

4. The method of claim 3, wherein the technology-dependent description is in terms of connected logic gates.

5. The method of claim 3, wherein performing the evaluation of each design option further comprises performing at least one simulation of the design option to validate a functional correctness of the design option.

6. The method of claim 5, wherein performing the evaluation of each design option further comprises determining, based on the at least one simulation, a power estimation of the design option.

7. The method of claim 6, wherein:
    performing the evaluation further comprises performing a data signal logging, and
    determining the power estimation based on the at least one simulation comprises determining the power estimation based on the data signal logging.

8. The method of claim 1, wherein each evaluation further comprises evaluating at least one of an area of the design option, a throughput of the design option, and an energy of the design option.

9. The method of claim 1, wherein each evaluation further comprises evaluating a trade-off between at least two of an area of the design option, a throughput of the design option, and an energy of the design option.

10. The method of claim 1, wherein the at least one design parameter further comprises a trace-back length.

11. The method of claim 1, further comprising implementing a Viterbi decoder with the selected design option.

12. The method of claim 1, wherein the Viterbi decoder comprises a pipeline model.

13. The method of claim 12, wherein the pipeline model comprises part of an application-specific instruction-set processor.

14. The method of claim 1, further comprising reducing at least one of a clock frequency and a core voltage of the selected design option based on a difference between the second value and the first value.

\* \* \* \* \*